United States Patent
Pang et al.

(10) Patent No.: US 7,891,821 B2
(45) Date of Patent: Feb. 22, 2011

(54) LASER BEAM TRANSFORMER AND PROJECTOR HAVING STACKED PLATES

(75) Inventors: H. Yang Pang, San Jose, CA (US); Murray K. Reed, Menlo Park, CA (US); Alexander O. W. Wiessner, Santa Clara, CA (US); R. Russel Austin, Cool, CA (US)

(73) Assignee: Coherent, Inc., Santa Clara, CA (US)

( * ) Notice: Subject to any disclaimer, the term of this patent is extended or adjusted under 35 U.S.C. 154(b) by 591 days.

(21) Appl. No.: 11/958,127

(22) Filed: Dec. 17, 2007

(65) Prior Publication Data

US 2009/0154518 A1    Jun. 18, 2009

(51) Int. Cl.
*G03B 21/14* (2006.01)
*G02B 27/10* (2006.01)

(52) U.S. Cl. .......................... 353/82; 359/618
(58) Field of Classification Search ............ 353/81, 353/82; 359/618–621
See application file for complete search history.

(56) References Cited

U.S. PATENT DOCUMENTS

| | | | |
|---|---|---|---|
| 5,784,203 A | 7/1998 | Beckmann | 359/618 |
| 5,986,794 A | 11/1999 | Krause et al. | 359/222 |
| 6,157,756 A | 12/2000 | Ishiwata | 385/31 |
| 6,421,178 B1 | 7/2002 | Lissotschenko et al. | 359/559 |
| 6,961,361 B1 | 11/2005 | Tanaka | 372/101 |
| 7,027,228 B2 | 4/2006 | Mikhailov | 359/623 |
| 7,061,959 B2 | 6/2006 | Partlo et al. | 372/55 |
| 7,135,390 B2 | 11/2006 | Tanaka | 438/487 |
| 7,268,062 B2 | 9/2007 | Tanaka et al. | 438/487 |
| 2007/0024979 A1 | 2/2007 | Lissotschenko et al. | 359/619 |
| 2007/0119836 A1* | 5/2007 | Schroeder | 219/121.75 |
| 2007/0149043 A1 | 6/2007 | Lissotschenko | 439/507 |
| 2008/0013182 A1* | 1/2008 | Ferber | 359/619 |

* cited by examiner

*Primary Examiner*—Thanh X Luu
(74) *Attorney, Agent, or Firm*—Morrison & Foerster LLP

(57) ABSTRACT

An original laser-radiation beam having a symmetrical $M^2$ but poor beam quality is sliced in one transverse axis, by a fanned-out stack of parallel transparent plates, into a plurality of beam slices. The beam-slices are also spread by the stack of plates in another transverse axis perpendicular to the first axis. A fanned-out stack of glass blocks aligns the spread beam-slices in the first axis to form what is effectively a single beam having an asymmetric $M^2$, with beam quality improved in one axis and degraded in the other compared with the original beam. The effective single beam is projected into a line of radiation by a cylindrical lens, or by a homogenizing projector including spaced apart cylindrical lens arrays followed by a spherical condenser lens.

17 Claims, 3 Drawing Sheets

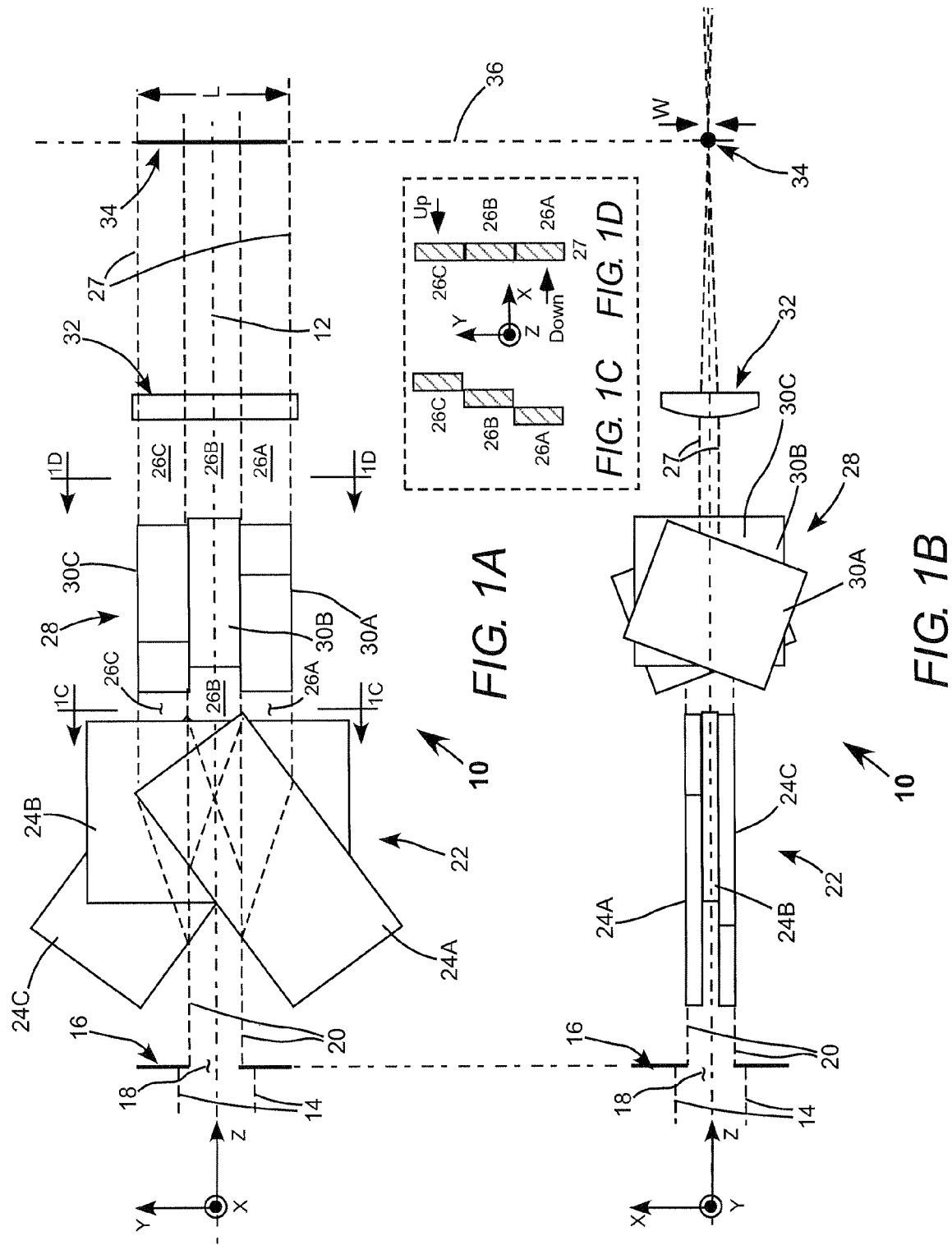

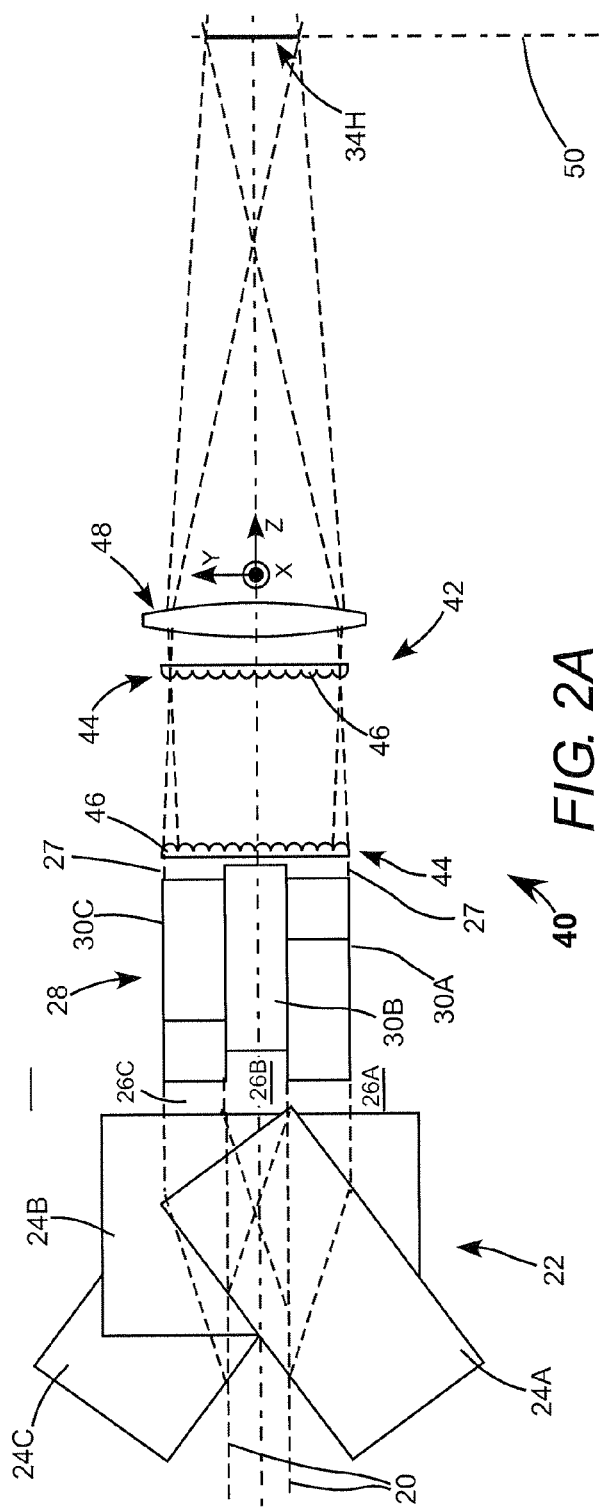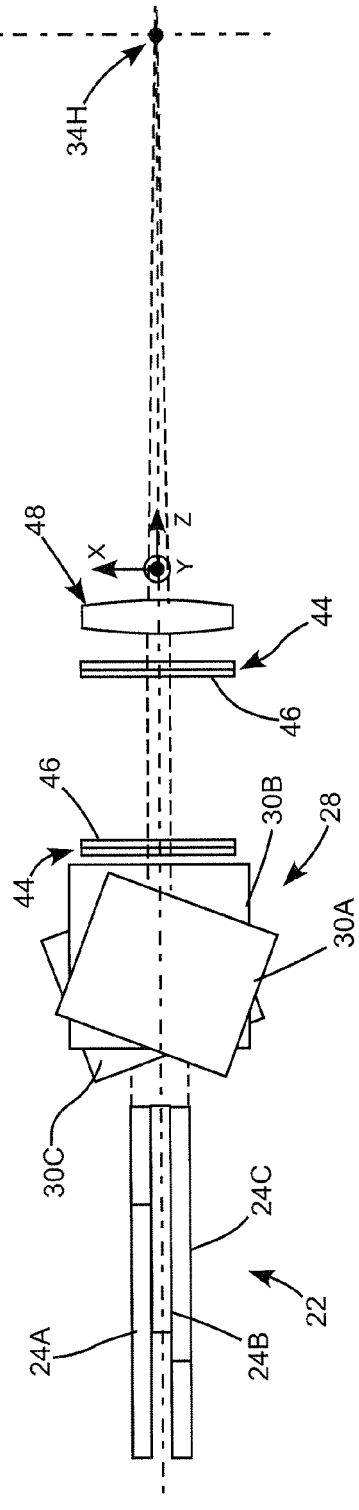
*FIG. 2A*
*FIG. 2B*

LASER BEAM TRANSFORMER AND PROJECTOR HAVING STACKED PLATES

TECHNICAL FIELD OF THE INVENTION

The present invention relates in general to projecting a laser beam on a workpiece. The invention relates in particular to projecting a high power, poor-quality, beam to form a line of radiation on the workpiece.

DISCUSSION OF BACKGROUND ART

In certain laser processing processes, such as laser annealing and laser crystallization of amorphous silicon (Si) layers, it is necessary to project laser radiation onto a workpiece in the form of a line of light. In projecting such a line it is desirable to have the smallest possible beam dimension in the width direction of the line to maximize the intensity of radiation in the line for a given line length. A limit to this is a line that has a width that is about diffraction limited, i.e., a line that has a width about comparable with the wavelength of radiation being projected. In the aforementioned processes it is usual to scan a workpiece through a line of radiation in a direction perpendicular to the line.

Typically, the higher the intensity that can be achieved in a projected line the faster the workpiece can be scanned and the higher the throughput of the process will be. Clearly, for any given line width and length, increasing the power in the beam being projected is the only way to increase line intensity. Accordingly, there is great interest in scaling the output power of lasers that deliver radiation at wavelengths useful for such processing. A CW power or an average power (in a pulsed beam) of greater than 500 Watts (W) is desirable In any given laser type, it is difficult to scale up laser power without sacrificing beam quality. Beam quality determines the width of a focal spot (or line) into which the beam can be projected. The quality is defined by a quantity $M^2$, the definition of which is well known to those familiar with the art. A single-mode ($TEM_{00}$) beam has an $M^2$ of slightly greater than 1.0 and can be projected into a near-diffraction-limited spot.

Laser costs do not scale linearly with power when beam quality must be maintained. Because of this, a laser delivering in excess of 500 W while still having a reasonable beam quality can be prohibitively expensive for certain manufacturing processes. One way of avoiding this problem has been to substitute for a single, very-high-power laser a plurality of lasers of lower power but higher beam quality and combine the laser output beams, using suitable optics, to form the line of radiation. Clearly, as far as the lasers are concerned, the cost of the plurality lasers will be at most about the product of the number of lasers and the cost of one, i.e., a linear scaling. As the number of lasers increases, however, the cost of fabricating an assembly of beam aligning, beam-combining, and beam-homogenizing optics that can be maintained in alignment in a commercial production environment becomes a significant part of a system. This tends to put a limit on the amount of beams that can practically be combined.

There is a need for apparatus that can project a line of radiation having a width of only a few times (say five-times) the diffraction limit from a very-high-power, poor-quality beam. The apparatus preferably should not require a complicated optical system that is difficult to align or difficult to maintain in alignment.

SUMMARY OF THE INVENTION

The present invention is directed to apparatus for projecting a laser beam characterized as having a transverse X-axis and a transverse Y-axis perpendicular to each other and propagating in a longitudinal Z-axis parallel to both of the transverse axes. In one aspect, apparatus in accordance with the present invention comprises a first stack of rectangular plates arranged at an angle to each other for slicing the laser beam in the X-axis into a plurality of beam-slices and spreading the slices parallel to the Y-axis direction with the spread of slices centered about the Z-axis. A second stack of rectangular plates is arranged to align the Y-axis-spread beam-slices along the Y-axis. A beam-projector, including a lens having optical power in at least the X-axis, is arranged to project the Y-axis aligned and spread beam-slices into a line of radiation about in an X-axis focal plane of the lens such that the line of radiation has a length in the Y-axis and a width in the X-axis.

In one preferred embodiment of the present invention, the beam projector includes a pair of cylindrical lens arrays with the cylindrical axis of the lenses in the arrays parallel to each other and parallel to the X-axis. Following the lens arrays in the Z-axis direction is another lens, in this case a spherical lens. The width of the projected line is in a focal plane of the spherical lens, and the length of the projected line is in an exit pupil of the beam projector parallel to the Y-axis.

Slicing the beam to provide the Y-axis-spread beam-slices and aligning the spread beam-slices in the X-axis provides to the beam-projector what is effectively a single beam having an $M^2$ value in the X-axis less than the X-axis $M^2$ value for the original beam by a factor about equal to the number of beam-slices, and an $M^2$ value in the Y-axis greater than the Y-axis $M^2$ value for the original beam by a factor about equal to the number of beam-slices. The reduction of X-axis $M^2$ in the effective (transformed) beam provides that the projected line of radiation can have a narrower width or a longer focal depth than would be possible if the original beam were projected into a line of radiation.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIGS. 1A and 1B are respectively Y axis and X-axis views schematically illustrating one preferred embodiment of laser-beam transformer and projector apparatus in accordance with the present invention, including a plurality of rectangular glass plates arranged to slice a laser-beam in the X-axis into a corresponding plurality of beam-slices at different X-axis heights spread in the Y-axis direction, a stack of glass of rectangular glass blocks arranged to align the spread beam-slices along the X-axis to form an elongated rectangular beam, and a cylindrical lens arranged to project the elongated rectangular beam into a line of radiation in a workpiece-plane.

FIG. 1C is a cross-section view seen generally in a direction 1C-1C of FIG. 1A schematically illustrating the X-axis sliced and Y-axis spread beam slices at the exit of the plurality of glass plates.

FIG. 1D is a cross-section view seen generally in a direction 1D-1D of FIG. 1A schematically illustrating the X-axis aligned and Y-axis spread beam-slices at the exit of the plurality of glass blocks.

FIGS. 2A and 2B are respectively Y axis and X-axis views schematically illustrating another preferred embodiment of laser beam transformer apparatus in accordance with the present invention, similar to the apparatus of FIGS. 1A and 1B but wherein the cylindrical lens is replaced by a Y-axis beam projector and homogenizer including two spaced-apart cylindrical lens arrays and a spherical lens.

DETAILED DESCRIPTION OF THE INVENTION

Figure 3:
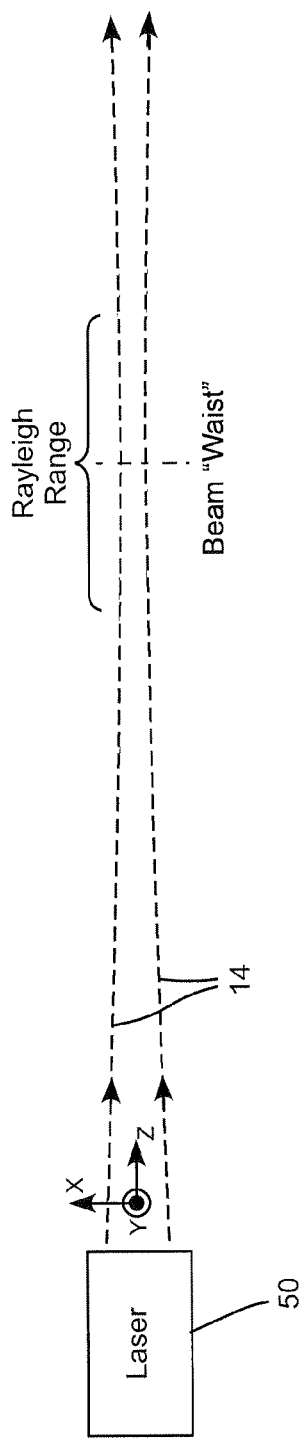
FIG. 3 schematically illustrates one form of a high-$M^2$ beam delivered by a laser suitable for use with an apparatus in accordance with the present invention, the beam having a beam-waist within a Rayleigh range of the beam remote from the laser.

Referring now to the drawings, wherein like components are designated by like reference numerals, FIG. 1A and FIG. 1B are respectively Y-axis and X-axis views schematically illustrating one preferred embodiment 10 of a laser beam transformer and projector in accordance with the present invention. The apparatus optionally includes plate 16 having a rectangular aperture 18 therein for forming a beam 14 to be transformed into a beam, designated as being bounded by dashed lines 20, having a rectangular cross-section.

It is assumed that beam 20 is a beam having relatively poor but about rotationally-symmetrical quality, for example, a beam having an $M^2$ of about 9 or greater in both the X-axis and the Y-axis of the inventive apparatus. It is assumed that the beam 20 is nominally collimated. Those skilled in the art will recognize that a poor quality beam can only be exactly collimated at one position therein. An impact of this is discussed further hereinbelow.

Apparatus 10 is arranged to transform the beam, before projection thereof takes place, into a beam having an asymmetrical beam quality, for example, a beam having as small as practical an $M^2$ in the X-axis, at the expense of increased $M^2$ in the Y-axis. In such a transformation the product of $M^2$ in both axes always remains constant. By way of example, if a beam having a symmetrical $M^2$ of 20.0 is transformed to provide an X-axis $M^2$ of 5.0, the Y-axis $M^2$ will be increased to 80.0. It will be evident from the following description how this occurs in the inventive beam transformer.

In apparatus 10, beam 20 is incident first on a stack 22 of rectangular, transparent, for example, glass or fused-silica, uniform-thickness plates 24. In this example only three plates 24A, 24B, and 24C, are depicted for simplicity of illustration. In practice, for a beam having an $M^2$ of about 20.0 or greater, it would be preferable to include five or more plates 24 in the stack. Generally, the number of plates can be determined by dividing the $M^2$ value of the beam to be transformed by the $M^2$ value desired in the X-axis.

The plates, arranged contiguous and parallel to each other in the X-Z plane, are also arranged in a fan shape with edges of adjacent plates at an angle to each other in the X-Z plane. Stack 22 functions as an X-axis beam slicer and Y-axis displacer. Beam 20 is sliced by the stack into three slices 26A, 26B and 26C at different heights in the X-axis and spread into different heights in the Y-axis.

Each beam-slice 26 has an X-axis $M^2$ that is one-third of the original symmetrical $M^2$ value of the beam. Each beam-slice has a Y-axis $M^2$ that is equal to the original symmetrical $M^2$ value. The path length in plates 24 and the angle between the plates is preferably selected such that the Y-axis height of the edge of one slice is the same as that of the opposite edge of an adjacent slice, such that the slices are about contiguous corner-to-corner as indicated in FIG. 1C.

Beam-slices 26A-C are then incident on a stack 28 of transparent uniform-thickness plates (blocks) 30 designated 30A, 30B and 30C in FIGS. 1A and 1B. The number of plates or blocks in stack 28 is the same as the number of plates in stack 22. Plates 30 are arranged contiguous and parallel to each other in the Y-Z plane, i.e., are oriented perpendicular to plates 24 in stack 22. Plates 30 are also arranged in a fan-shape with edges of adjacent plates at an angle to each other in the Y-Z plane. It should be noted that plates 30 must be made thicker than plates 24 in order to accommodate the Y-axis width of each beam-slice, which is about the same or slightly greater (taking divergence into account) as the Y-axis width of (un-sliced) beam 20.

Preferably the corresponding dimensions of the plates in stack 22B are selected relative to each other such that the optical path length through the plates to stack 28 is the same for each beam slice. In stack 22, in which there are only three plates, plates 24A and 24C have the same length and the length of plate 24B is longer than that of plates 24A and 24B for making this optical path length equalization. Preferably also, corresponding dimensions of plates or blocks in stack 28 are selected relative to each other such that the optical path through length the plates to any plane perpendicular to the Z-axis following the stack is the same.

Stack 30 functions as an X-axis beam aligner. In the example of FIGS. 1A and 1B, the X-axis height of beam-slice 26B is left unchanged by stack 28. The beam-path length of the plates and the angle therebetween is selected such that the stack moves beam-slices 26A and 26C respectively "down" and "up" in the X-axis direction such that slices 26A, 26B, and 26C become aligned in the x-axis and about contiguous in the Y-axis as indicated in FIG. 1D.

The slices form, in effect, a single beam 27 having an $M^2$ value in the X-axis that is a third of the symmetrical $M^2$ value of beam 20, and an $M^2$ value in the Y-axis that is three-times the symmetrical $M^2$ value of beam 20. This effectively single beam 27 having asymmetric $M^2$, is projected by a cylindrical lens 32 having positive optical power in the X-axis and zero optical power in the Y-axis. As noted above it is preferable that the optical path length of the beam-slices through the stacks of plates to the plane of the lens is the same. The projected beam forms a line of radiation having a length L and a width W in an X-axis focal plane of lens 32. The small X-axis $M^2$ of beam 27 permits W to be much less than would be possible with the $M^2$ value of the original beam 20.

It is pointed out here that apparatus 10 is a simple (basic) example of the apparatus in accordance with the present invention and was devised to examine, by computation and experiment, the effectiveness of the X-axis M reduction on the minimum possible width of line 34. In one computed example, beam 20 was assumed to have a symmetrical $M^2$ value of 20 and an X-axis width of about 10.0 millimeters (mm). Radiation in the beam was assumed to be essentially monochromatic at a wavelength of 0.532 micrometers (μm). Plates 24 were assumed to have a thickness of 3.0 mm and a length of 25.0 mm, with plate 24B parallel to the Z-axis and plates 24A and 24C at respectively plus 52.5 degrees and minus 52.5 degrees to the Z-axis. Plates (blocks) 30 were assumed to have a thickness of 15.0 mm, with plate 30B parallel to the Z-axis and plates 24A and 24C at respectively plus 20.7 degrees and minus 20.7 degrees to the Z-axis. Width W, at the $1/e^2$ of peak intensity points, was about five times the diffraction limited width. A narrower width would be possible if more than three plates were included in each of stacks 22 and 28.

A shortcoming of basic apparatus 10 is that Y-axis intensity distribution along line 34 would be somewhat non-uniform. Clipping of original beam 14 by aperture 18 will provide some measure of Y-axis uniformity of illumination, but less than optimum uniformity.

FIG. 2A and FIG. 2B schematically illustrate another embodiment 40 of beam transforming and projecting apparatus in accordance with the present invention. Apparatus 40 is similar to apparatus 10 of FIGS. 1A and 1B with an exception that cylindrical lens 32 of apparatus 10 is replaced in apparatus 40 by a Y-axis homogenizing projector 42.

Homogenizing projector 42 includes (recited in the direction of beam propagation) two arrays 44 of elongated, plano-convex, cylindrical lenses 46. The arrays are spaced apart along the Z-axis with the cylindrical lenses parallel to the X-axis. Cylindrical lenses 46 have positive optical power in the Y-axis and zero optical power in the X-axis. Preferably the arrays have the same number of lenses therein, the lenses in each of the arrays have the same focal length, and the arrays are spaced apart by about the Y-axis focal length of the cylindrical lenses therein. Convex surfaces of the lenses in one of the arrays are arranged facing convex surfaces in the other. A spherical lens 48 follows the lens arrays.

The effect of the lens arrays in cooperation with lens 48 is to divide effective asymmetrical-$M^2$ beam 27 described above into a plurality of beam portions equal in number to the number of lenses in the array, and to spread each portion into an exit pupil of projector homogenizer 42, the exit pupil coinciding with X-axis focal plane 50 of the projector-homogenizer. This forms a Y-axis homogenized line of radiation 34H in plane 50. As each cylindrical-lens-contribution to line 50 extends along the entire length of line 34H, any Y-axis intensity-variations across beam 27 incident on the first microlens array 44 are averaged out along the line. Preferably the number of lenses 46 per array 44 is great than three. It is also preferable that, whatever the number of cylindrical lenses in the array, the lenses should be arranged cooperative with the number of plates such that a boundary between any two plates 30 in stack 28 thereof is aligned with a boundary between two cylindrical lenses 46, as depicted in FIG. 2A.

In one preferred embodiment, each array includes about fifteen cylindrical lenses. This larger number can provide a uniformity of illumination along line 34H of within about ±5% of a nominal average value. This arrangement is somewhat tolerant of slight overlap or gaps between beam slices forming beam 27. The minimum X-axis width of the line is dependent, for any given symmetrical $M^2$ value of beam 20, on the number of plates in stacks 22 and 28 as described above. The relationship between the line-width and the number of plates, however, is not necessarily linear.

It should be noted, here, that apparatus described with reference to FIGS. 1A-B and 2A-B is arranged to provide a greater focal depth at the line of light than would be possible if original beam 14 were projected without transformation by plate stacks 22 and 28. The minimum line width possible in these arrangements would be the same with and without beam transformation.

The line width can be reduced by expanding the "transformed" beam in the X-axis direction between plate stack 28 and the beam projector, for example between the plate stack and the first lens array in FIG. 2B, with a minimum width obtainable when the X-axis dimension of the transformed beam is the same as the X-axis dimension of the original beam. In this case, however, the maximum focal depth obtained with the transformed beam would be the same as that which would be obtained if the original beam were projected without transformation. An experimental example of the apparatus of FIGS. 1A and 1B was constructed to compare practical results with the computed results described above. In this experiment, it was determined that it is important to have the beam being transformed optimally collimated in plate stacks 22 and 28. A description of one means by which this can be achieved is set forth below with reference to FIG. 3 and FIG. 4.

FIG. 3 schematically illustrates one form of a multimode (high $M^2$) laser beam delivered from a laser 50 and used with the experimental apparatus. The beam is designated by reference numerals 14 for consistency. While the beam can be described as nominally collimated as it propagates over typical distances from the laser to apparatus for processing the beam converges to a narrowest diameter (beam-"waist") at a distance from the laser. The beam diverges on propagating beyond the beam waist position. Beam properties, however, can be assumed to be about the same as those at the beam waist within the Rayleigh range of the beam. This is defined as the length of the beam between points at which the beam diameter is the beam diameter at the beam waist position times the square-root of two, i.e., about 1.414, as is known in the art. Apparatus in accordance with the present invention is believed to function optimally when the Rayleigh range of the beam is about centered in the Z-axis over plate-stacks 22 and 28.

Figure 4:
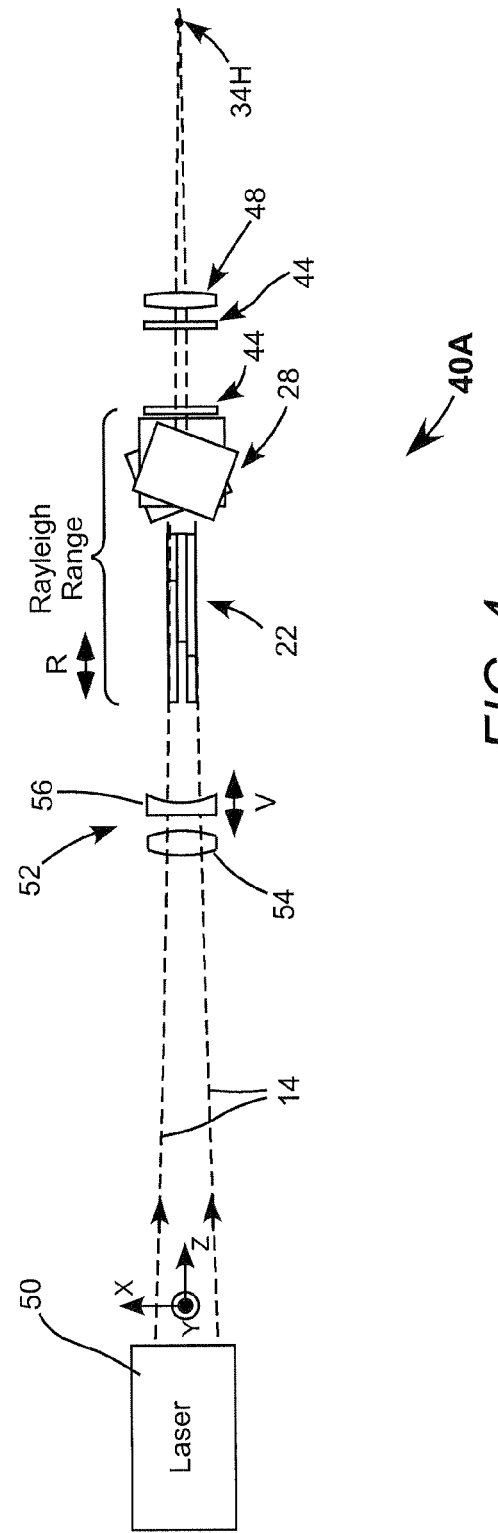
FIG. 4 is an X-axis view schematically illustrating yet another embodiment of laser beam transformer in accordance with the present invention similar to the apparatus of FIGS. 2A and 2B and arranged to receive the beam from the laser of FIG. 3, but further including a telescope having a movable optical element arranged to optimize the position of the Rayleigh range of the beam with respect to the stack of plates and the stack of blocks.

The position of the Rayleigh range from a laser can vary somewhat between lasers that are nominally the same, and can also vary in any one laser with operating parameters of the laser. This can make locating the Rayleigh range an uncertain proposition. To compensate for this uncertainty in the experimental apparatus, the apparatus can be modified as depicted in FIG. 4. Here, apparatus 40A (shown only in an X-axis view) is arranged as apparatus 40 of FIG. 2B with an exception that a telescope 52 included between the laser and plate-stack 22. In this example, telescope 52 includes a positive lens 54 and a negative lens 56. Axial spacing between lenses 54 and 56 is selectively variable, in this case, by axially moving lens 56 with respect to lens 54 as indicated by arrows V. Changing the spacing between the lenses changes the axial position of the Rayleigh range as indicated by arrows R, and enables the range to be optimally positioned (centered) over plate-stacks 22 and 28.

Such a telescope was included in the experimental example of the apparatus of FIGS. 1A and 1B discussed above. It was found that optimizing the Rayleigh range position with respect to the plates could be accomplished by relative spacing changes sufficiently small that the magnification of the telescope did not vary significantly from the nominal value.

In this experimental apparatus the telescope was formed from a positive lens 54 having a focal length of 286 mm and a negative lens 56 having a focal length of −286 mm with the lenses arranged to provide a telescope having nominally unit magnification. Dimensions of other components were as discussed above with reference to the theoretical computation. The input beam was a round beam having a diameter of about 10.0 mm and had a measured $M^2$ of about 9.0 in both the X- and Y-axes. This beam was transformed by the plate-stacks to a beam having a measured M2 in the X-axis of about 2.5 and a measured $M^2$ in the Y-axis of about 30.0. An afocal telescope having a magnification greater than or less than one can be used to either increase or reduce the beam size at the plates if desired.

Those skilled in the art will recognize that further embodiments and modifications of the inventive apparatus are possible without departing from the spirit and scope of the present invention. By way of example, some pre-shaping of beam 14 may be effected by an anamorphic telescope. Spherical lens 48 of apparatus 40 may be replaced by crossed cylindrical lenses of different optical power for further optimizing the projected line of radiation. Apertures and baffles may be included within either apparatus 10 or apparatus 40 to prevent any stray radiation caused, for example, by an inexact fit of beam 20 to plate-stack 22, from reaching the focal plane of the projector. Those skilled in the art will also recognize that while the present invention is described above with reference to transforming a beam having a symmetrically poor quality, the apparatus is equally effective for transforming a beam that does not have exactly symmetrical beam quality ($M^2$).

In general, while the present invention is described above in terms of preferred embodiments. The invention is not limited to the embodiments described and depicted. Rather, the invention is limited only by the claims appended hereto.

What is claimed is:

1. Apparatus for projecting a laser-beam delivered by a laser located at a fixed distance from the apparatus, said laser beam characterized as having a transverse X-axis and a transverse Y-axis perpendicular to each other and propagating in a longitudinal Z-axis perpendicular to both of the transverse axes, wherein the laser-beam has a characteristic beam-waist size within a Rayleigh range, the Rayleigh range being characterized as the length of the beam between points therein at which the beam has a beam size that is about the square-root-of-2 times the beam-waist size, the apparatus comprising:
    a first stack of plates arranged at an angle to each other for slicing the laser beam in the X-axis into a plurality of beam-slices and spreading the slices parallel to the Y-axis direction with the spread of slices;
    a second stack of plates arranged to align the Y-axis-spread beam-slices along the X-axis;
    a beam-projector including a lens having optical power in at least the X-axis and arranged to project the Y-axis aligned and spread beam-slices into a line of radiation about in an X-axis focal plane of the lens such that the line of radiation has a length in the Y-axis and a width in the X-axis; and
    a telescope having first and second optical elements having a selectively variable Z-axis spacing therebetween and wherein varying the spacing between the optical elements varies the Z-axis position of the Rayleigh range with respect to the stacks of plates in a manner so that the Rayleigh range is about centered in the Z-axis over the first and second stacks of plates.

2. The apparatus of claim 1, wherein the beam-projector further includes a Y-axis beam-homogenizer located between the second stack of rectangular plates and the lens of the beam-projector.

3. The apparatus of claim 2, wherein the Y-axis beam-homogenizer includes two arrays of elongated cylindrical lenses spaced apart from each other in the Z-axis direction, the cylindrical lenses in each of the arrays being parallel to the x-axis and having positive optical power in the Y-axis and zero optical power in the X-axis.

4. The apparatus of claim 3, wherein each of the arrays includes the same number of cylindrical lenses.

5. The apparatus of claim 4 wherein there are at least three cylindrical lenses in each of the arrays thereof.

6. The apparatus of claim 5, wherein there are fifteen cylindrical lenses in each of the arrays thereof.

7. The apparatus of claim 1, wherein corresponding dimensions of the plates in the first stack thereof are selected such that the optical path lengths of each of the beam-slices through the first stack and to the second stack of plates are about equal.

8. The apparatus of claim 7, wherein corresponding dimensions of the plates in the second stack thereof are selected such that the optical path lengths of each of the beam-slices through the second stack and to the beam projector are about equal.

9. The apparatus of claim 1, wherein each of the stacks of plates has the same number of plates therein.

10. The apparatus of claim 9, wherein there are three plates in each stack thereof.

11. The apparatus of claim 1, wherein the first optical element of the telescope has positive optical power and the second optical element of the telescope has negative optical power.

12. The apparatus of claim 11, wherein the magnitude of the optical power of the first and second optical elements is about the same.

13. The apparatus of claim 1, wherein beam has a beam-width in the Y-axis on entering the first stack of plates and plates in the second stack thereof have a thickness about equal to greater than the beam-width.

14. An apparatus for receiving a beam of light from a laser having transverse X and Y axes and projecting a line of light on a target along the Y axis, said apparatus comprising:
    a first set of transparent plates stacked along the X axis, each plate having substantially parallel input and output faces and wherein the faces of at least two of the plates are disposed at an angle with respect to the propagation axis of the beam so that portions of the beam at different X positions intercepting said two plates are displaced in the Y axis;
    a second set of transparent plates stacked along the Y axis, each plate having substantially parallel input and output faces and wherein the faces of the plates are arranged to align the beam portions transmitted by the first set of plates along the Y axis with a common X position;
    a focusing arrangement for projecting the light transmitted by the second set of plates into a line of light at a target plane; and
    an optical telescope located between the laser and the first set of plates for adjusting the Rayleigh range of the beam with respect to the sets of plates.

15. An apparatus as recited in claim 14, further including a beam homogenizer located between the second set of plates and the focusing arrangement.

16. An apparatus as recited in claim 15, wherein the beam homogenizer is defined by a pair of spaced apart cylindrical lens arrays.

17. An apparatus as recited in claim 14, wherein the focusing arrangement includes a cylindrical lens.

* * * * *